(12) United States Patent
Cheng et al.

(10) Patent No.: US 11,963,326 B2
(45) Date of Patent: Apr. 16, 2024

(54) ELECTRICAL CONNECTOR WITH IMPROVED CARRIER FRAME

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Shan-Yong Cheng, New Taipei (TW); Chen-Wei Yang, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 84 days.

(21) Appl. No.: 17/715,200

(22) Filed: Apr. 7, 2022

(65) Prior Publication Data
US 2022/0328989 A1    Oct. 13, 2022

(30) Foreign Application Priority Data
Apr. 8, 2021   (CN) .......................... 202120713805.6

(51) Int. Cl.
*H05K 7/14*    (2006.01)
(52) U.S. Cl.
CPC .................. *H05K 7/1431* (2013.01)

(58) Field of Classification Search
None
See application file for complete search history.

(56) References Cited

U.S. PATENT DOCUMENTS

| 8,905,765 B2 * | 12/2014 | Yeh .......................... H05K 7/00 439/73 |
| 9,949,396 B2 * | 4/2018 | Zhang ..................... G06F 1/183 |
| 10,653,028 B2 | 5/2020 | Su |
| 2021/0126389 A1 | 4/2021 | Cheng |

FOREIGN PATENT DOCUMENTS

| CN | 110838634 A | 2/2020 |
| CN | 211428431 U | 9/2020 |

* cited by examiner

*Primary Examiner* — Ross N Gushi
(74) *Attorney, Agent, or Firm* — Ming Chieh Chang (57) ABSTRACT

An electrical connector includes an insulative housing extending in a horizontal direction, a plurality of conductive terminals retained in the insulative housing, a metallic stiffener surrounding the insulative housing, a load plate pivotally mounted upon the metallic stiffener and moveable between an open position and a closed position, and a carrier frame used for retaining and receiving a central processing unit (CPU) and carrying the CPU to the insulative housing. After retaining the CPU, the carrier frame is mounted on the insulative housing along a vertical direction perpendicular to the horizontal direction. The load plate is rotated to the closed position to fix the CPU on the insulative housing.

12 Claims, 8 Drawing Sheets

ELECTRICAL CONNECTOR WITH IMPROVED CARRIER FRAME

BACKGROUND OF THE INVENTION

1. Field of the Invention

The present invention relates to an electrical connector, and particularly to a chip socket or CPU socket used to receive a CPU (Central Processing Unit) and connecting to a PCB (Printed Circuit Board).

2. Description of Related Arts

China Patent published No. CN110350333A discloses an electrical connector electrically connecting a chip module to a circuit board. The electrical connector includes a base, a rail frame pivotally connected to the base, a clamping frame that can slide relative to the rail frame, and a cover pivotally connected to the base. The chip module mounted on the clamping frame is loaded into or removed from a slide rail provided on the rail frame, and is pressed by the cover. However, when the clamping frame carries a chip module with a large mass, the rail frame and the clamping frame may be deformed due to excessive force, resulting in a short service life of the electrical connector.

Therefore, it is desired to provide an electrical connector for carrying larger chip modules.

SUMMARY OF THE INVENTION

The instant invention is to provide an electrical connector for carrying larger mass chip modules.

To achieve the above-mentioned object, an electrical connector comprises an insulative housing extending in a horizontal direction, a plurality of conductive terminals retained in the insulative housing, a metallic stiffener surrounding the insulative housing, a load plate pivotally mounted upon the metallic stiffener and moveable between an open position and a closed position, and a carrier frame used for retaining and receiving a Central Processing Unit (CPU) and carrying the CPU to the insulative housing. After retaining the CPU, the carrier frame is mounted on the insulative housing along a vertical direction perpendicular to the horizontal direction. The load plate is rotated to the closed position to fix the CPU on the insulative housing.

Other advantages and novel features of the invention will become more apparent from the following detailed description of the present embodiment when taken in conjunction with the accompanying drawings.

DETAILED DESCRIPTION OF THE PREFERRED EMBODIMENT

Reference will now be made in detail to the preferred embodiments of the present invention.

Figure 1:
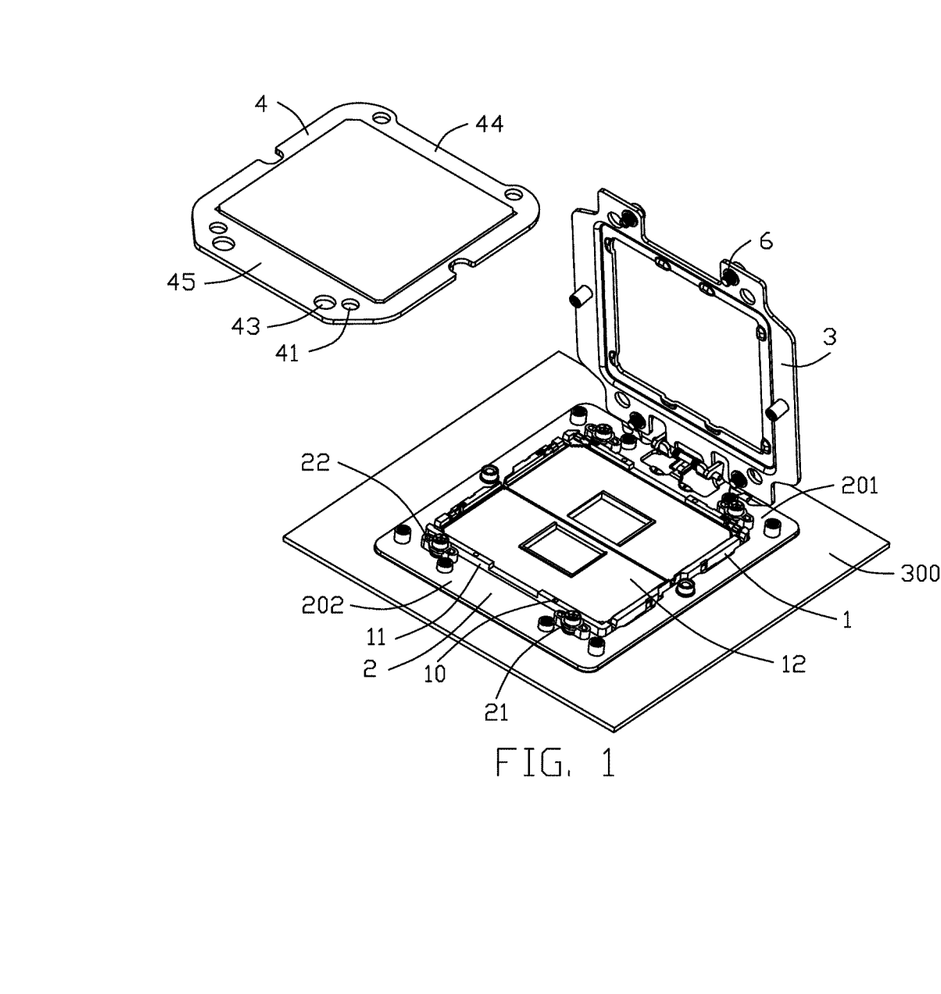
FIG. 1 is a perspective view of an electrical connector mounted on a printed circuit board (PCB) and a CPU of the present invention wherein a carrier frame of the electrical connector holding the CPU and ready to be assembled into the electrical connector.
Figure 2:
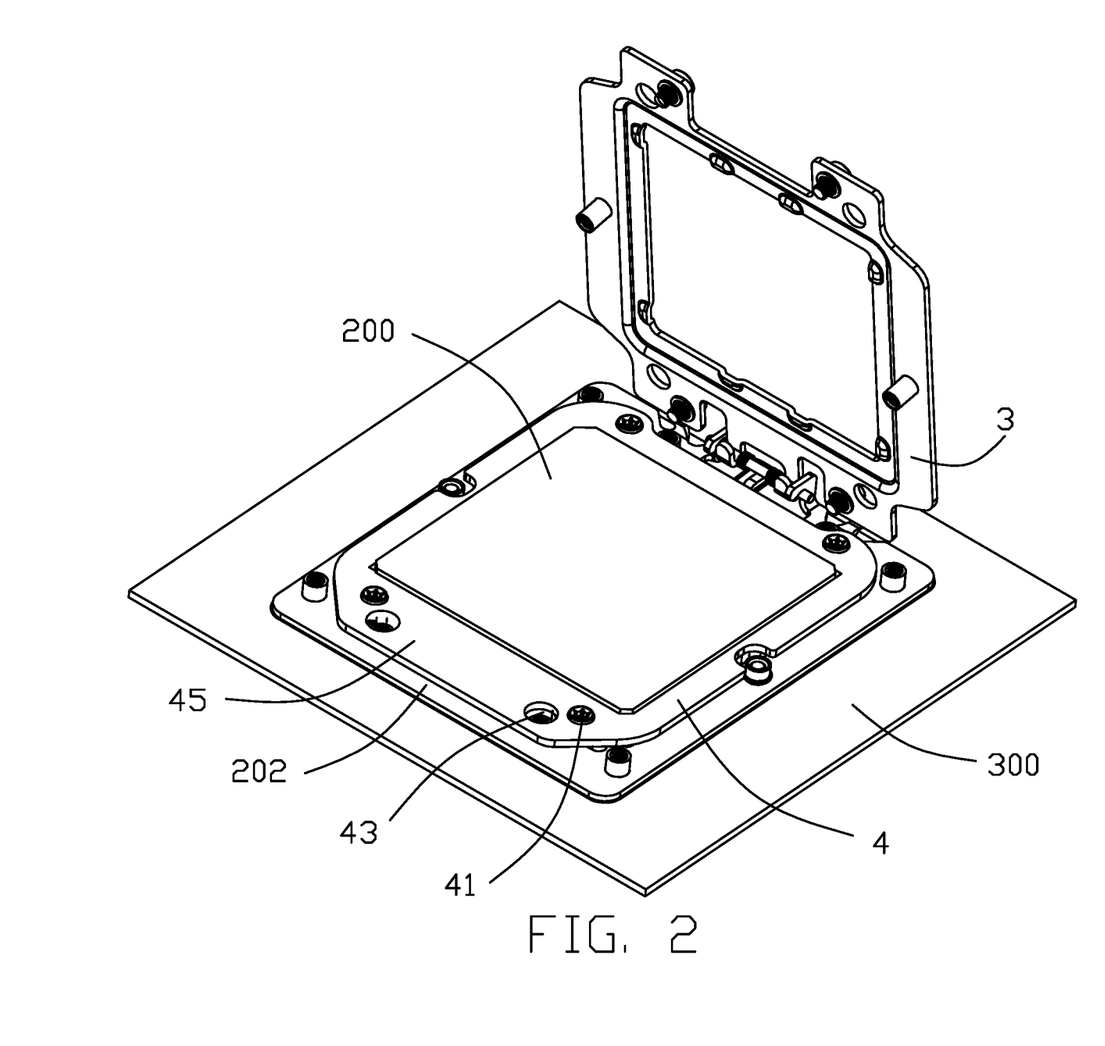
FIG. 2 is a perspective view of the electrical connector of FIG. 1 wherein the CPU is assembled in the electrical connector.
Figure 3:
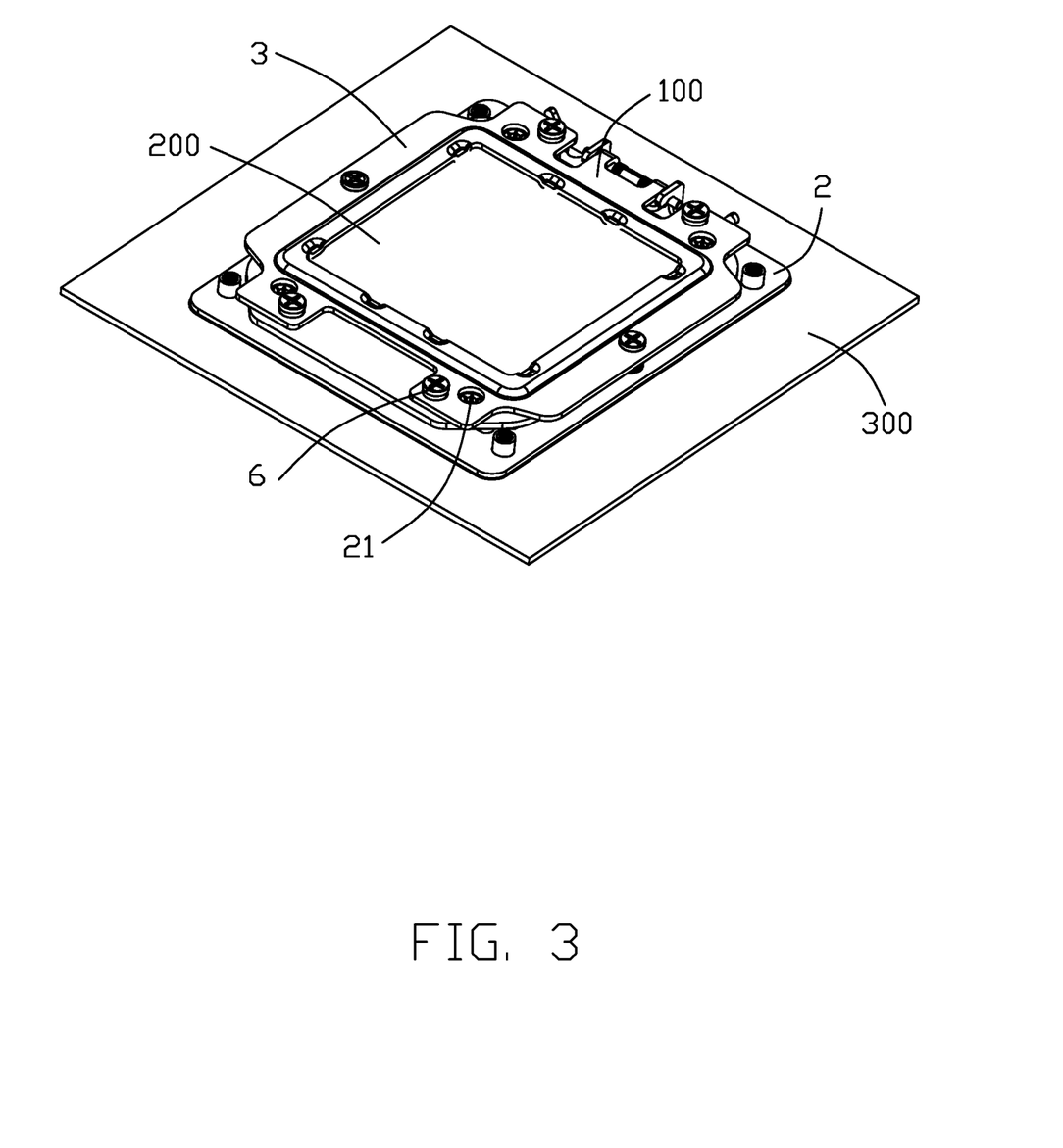
FIG. 3 is a perspective view of the electrical connector of FIG. 2 wherein the load plate of the electrical connector is rotated to a closed position.

As shown in FIGS. 1-3, the electrical connector 100 of the present invention mounted on a PCB 300 is to receive a CPU (Central Processing Unit) 200 or other chip modules and electrically connect to the PCB 300. The electrical connector 100 comprises an insulative housing 1 extending in a horizontal plane and loaded with a plurality of conductive terminals (not shown) in a matric pattern therein, a metallic stiffener 2 surrounding the insulative housing 1, a load plate 3 pivotally mounted upon the metallic stiffener 2 and moveable between an open position wherein the load plate 3 is away from the housing 1 as shown in FIG. 1 and a closed position wherein the load plate 3 is near to the housing 1 as shown in FIG. 3, and a carrier frame 4 used for retaining the CPU 200 and carrying the CPU 200 to the insulative housing 1. The carrier frame 4 carrying with the CPU is inserted into the insulative housing 1 along a vertical direction perpendicular to the insulative housing 1. The load plate 3 is then rotated to the closed position and retained with the metallic stiffener 2 by screws. The carrier frame 4 is sandwiched between the stiffener 2 and the load plate 3. Therefore, the CPU 200 is received and retained in the insulative housing 1.

Figure 4:
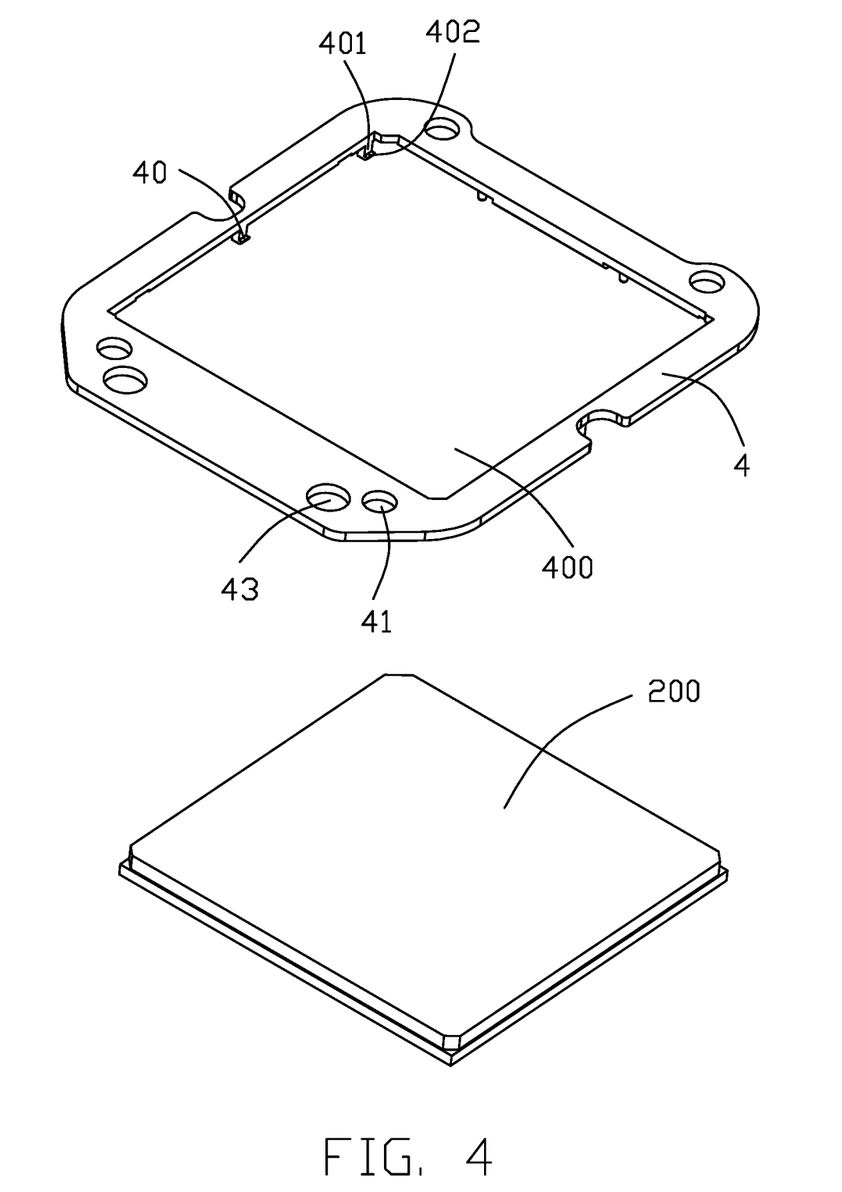
FIG. 4 is an exploded perspective view of the carrier frame of the electrical connector and the CPU of FIG. 1.
Figure 5:
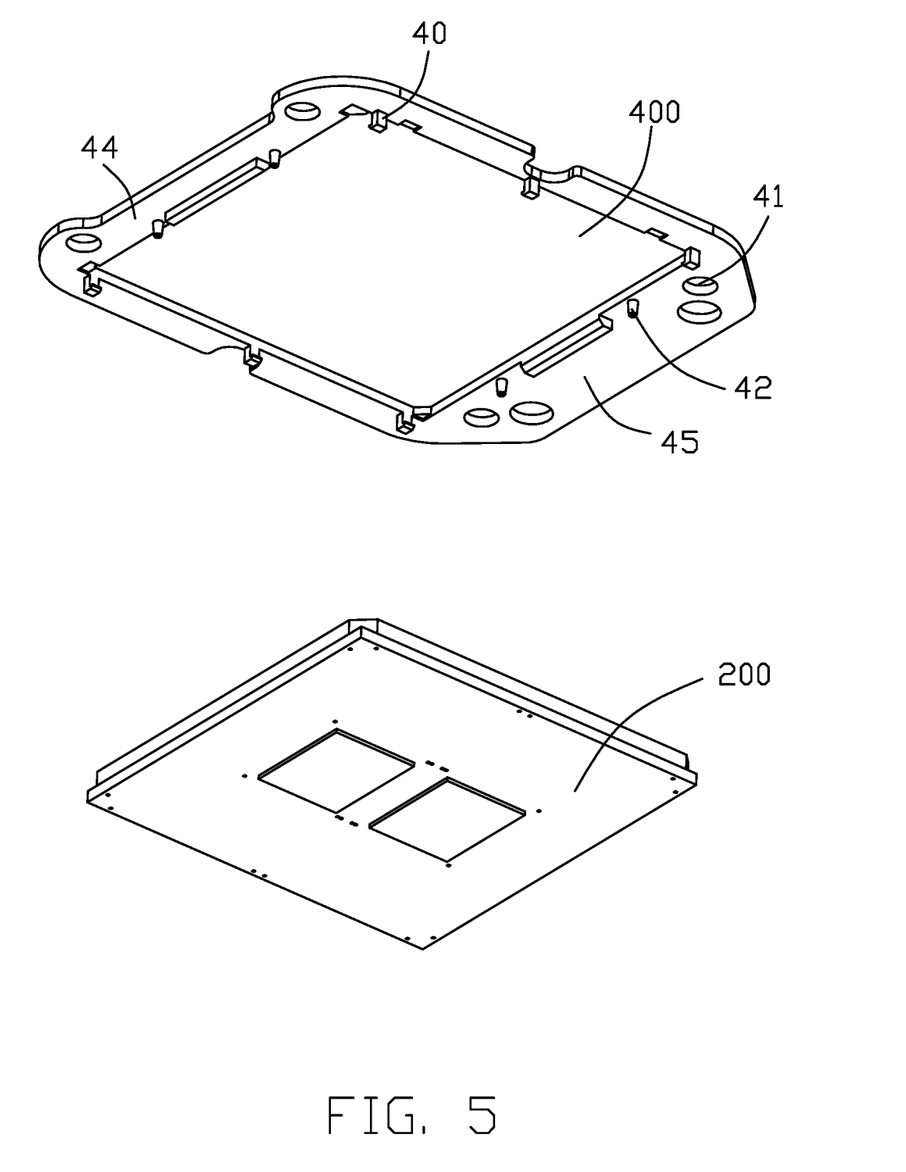
FIG. 5 is another exploded perspective view of FIG. 4.
Figure 6:
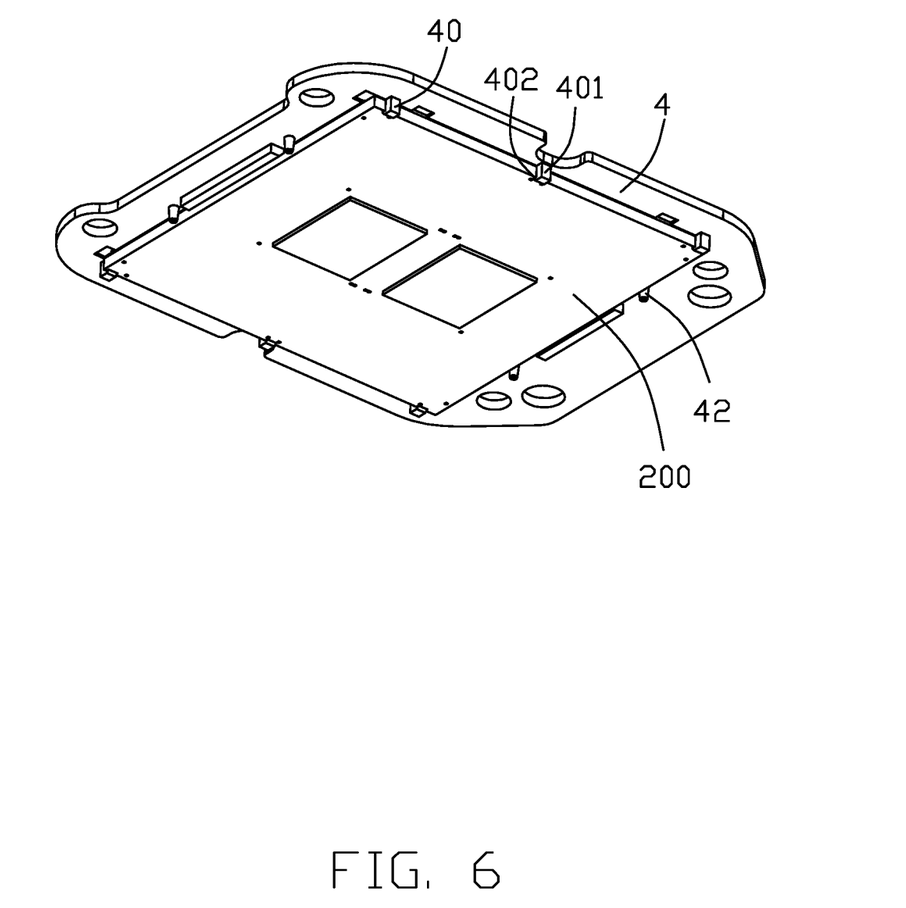
FIG. 6 is another perspective view of the carrier frame and the CPU of FIG. 1.

When the carrier frame 4 carries the CPU 200 with a larger mass, the carrier frame 4 is assembled on the insulative housing 1 by being placed on the housing 1 directly, which can effectively avoid the deformation of the carrier frame 4. Referring to FIGS. 4-6, the carrier frame 4 defines a large opening 400 therein with side edges surrounding the large opening 400, pairs of latches 40 extending downwardly along the large opening 400. Each latch 40 includes a vertical portion 401 extending downwardly from the lower surface of the carrier frame 4 and a horizontal portion 402 extending toward corresponding the other latch, so as to define a CPU-receiving space. The upright side face of the CPU 200 received in the space is limited by the vertical portion 401. The edges of the bottom face of the CPU are seated on the horizontal portion 402. In this embodiment, the carrier frame 4 is provided with three pairs of latches 40.

A preliminary positioning structure and a final positioning structure are provided on the carrier frame 4 and the metallic stiffener 2 or the carrier frame 4 and the insulative housing 1, thereby resulting in a smooth insertion of the carrier frame 4 to the metallic stiffener 2. Specifically, in this embodiments of the present invention, the metallic stiffener 2 defines a protruding cylinder 21 protruding upward. The carrier frame 4 defines a first positioning hole 41 matched with the protruding cylinder 21. The first positioning hole 41 is aligned with the protruding cylinder 21 to complete a preliminary positioning alignment. The carrier frame 4 defines a dowel pin 42 protruding downward. The insulative housing 1 defines a second positioning hole 10 matched with the dowel pin 42. The dowel pin 42 is aligned with the second positioning hole 10 to complete a final positioning alignment. The preliminary positioning structure is conducive to enabling a quickly match of the carrier frame 4 to corresponding components. The final positioning structure can further accurately position the carrier frame 4.

Referring to FIGS. 1 and 5, the radial dimensions of the dowel pin 42 and the second positioning hole 10 are smaller than the radial dimensions of the protruding cylinder 21 and the first positioning hole 41. The positioning and assembly of the carrier frame 4 is divided into two easy-to-operate steps, which can effectively improve the positioning accuracy of the carrier frame 4 and the convenience of operation.

As shown in FIGS. 1-3, in the vertical direction, the protruding cylinder 21 is lower than the load plate 3. Different from some existing electrical connectors provided with a relatively high protruding cylinder for matching with a carrier frame, the protruding cylinder 21 of the present invention is beneficial to provide a space for the rotation of the load plate 3. The insulative housing 1 comprises four side walls 11 and a bottom wall 12 located inside the four side walls 11, commonly defining a CPU-receiving cavity. The conductive terminals are fixed on the bottom wall 12. The second positioning hole 10 is arranged on the side wall 11. In this embodiment, the electrical connector 100 has two second positioning holes 10 on a pair of opposite side walls 11.

Figure 7:
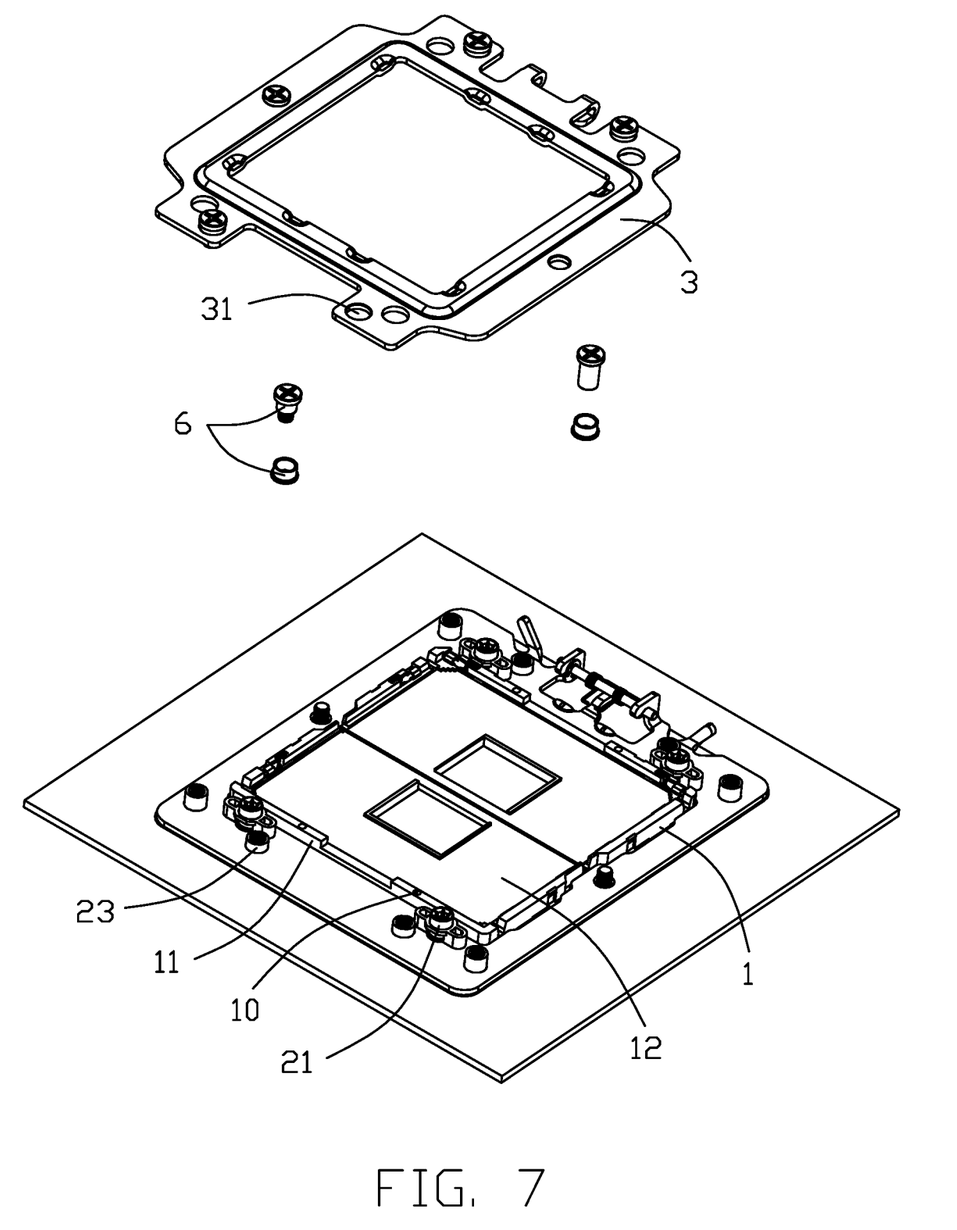
FIG. 7 is a partially exploded perspective view of the electrical connector of FIG. 1 wherein the carrier frame is not shown.
Figure 8:
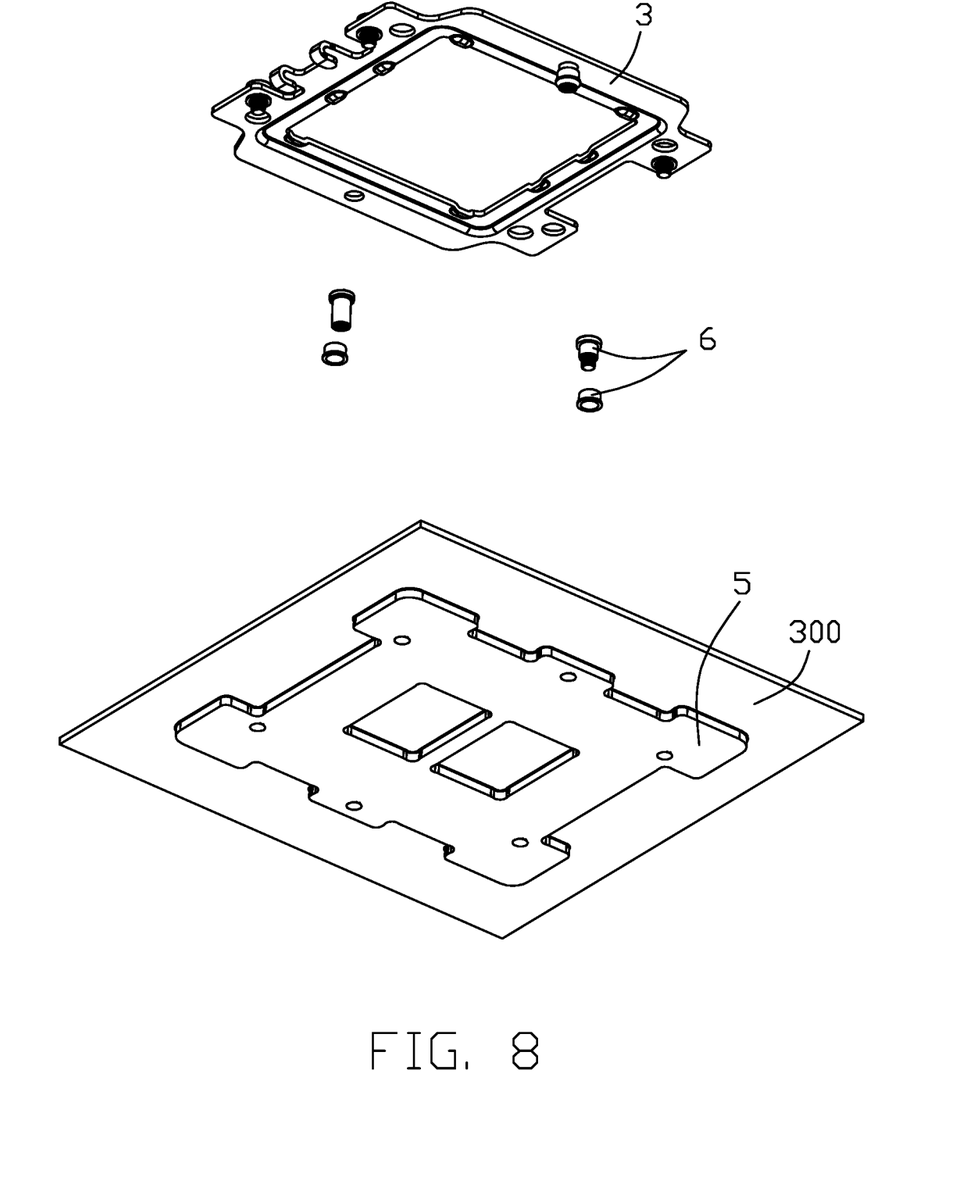
FIG. 8 is another perspective view of FIG. 7.

The metallic stiffener 2 is fixed to the printed circuit board 300 by a plurality of nuts or screws. The protruding cylinder 21 is formed by the nuts or screws exposed to the metallic stiffener 2. As shown in FIGS. 7 and 8, in this embodiment, the electrical connector 100 includes a backplane 5. The backplane 5 and the metallic stiffener 2 are respectively disposed on the opposite upper side and lower side of the circuit board 300. The protruding cylinder 21 is a nut that is locked to the backplane 5 and exposed to the metallic stiffener 2. The electrical connector 100 comprises a spacer 22 sleeved on the protruding cylinder 21, and the carrier frame 4 is mounted on the spacer 22 to prevent the CPU 200 from being damaged due to excessive pressing of the carrier frame 4.

Referring to FIG. 1, in the preferred embodiments of the present invention, the metallic stiffener 2 includes a first edge 201 and a second edge 202 opposite to each other. The load plate 3 is pivotally connected to the first edge 201. The protruding cylinders 21 are located at four corners of the metallic stiffener 2 and are paired on the first edge 201 and the second edge 202. The side edge of the carrier frame includes a first side edge 44 and a second side edge 45 corresponding to the first edge 201 and second edge 202 respectively. The first positioning holes 41 are located at four corners of the carrier frame 4 and are paired on the first side edge 44 and the second side edge 45.

Referring to FIGS. 1-3 and FIGS. 7-8, the metallic stiffener 2 is provided with a first locking hole 21. The carrier frame 4 is corresponding provided with a second locking hole 43. The electrical connector 100 comprises a locking member 6. When the load plate 3 rotates to the closed position and presses on the carrier frame 4, the locking member 6 sequentially passes through the first and second locking holes 31, 41 from top to bottom and is fixed to the metallic stiffener 2 or the backplane 5. Thereby, the load plate 3 and the carrier frame 4 are assembled stably. In this embodiment, the second locking hole 43 is located on the second side edge 402 and is staggered from the first positioning hole 41. A plurality of locking fittings 23 are fixed on the second edge 202 of the metallic stiffener 2. The locking members 6 and the locking fittings 23 are aligned and locked with each other.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector adapted for mounting on a printed circuit board, comprising:
   an insulative housing loaded with a plurality of conductive terminals therein;
   a metallic stiffener surrounding the insulative housing and retained on the printed circuit board;
   a load plate pivotally mounted upon the metallic stiffener and moveable between a closed position proximate to the insulating housing and an open position distal from the insulating housing; and
   a carrier frame used for retaining and receiving a central processing unit (CPU);
   wherein the carrier frame loaded with the CPU is inserted into the insulative housing along a vertical direction perpendicular to the insulative housing and retained by the load plate; and
   wherein a preliminary positioning structure is arranged between the carrier frame and the metallic stiffener, a final positioning structure is arranged between the carrier frame and the insulative housing, and the preliminary positioning structure is docked before the final positioning structure during the carrier frame is inserted in the insulative housing.

2. The electrical connector as claimed in claim 1, comprising a locking member, wherein the metallic stiffener defines a first locking hole, the carrier frame defines a second locking hole, and the locking member sequentially passes through the first and second locking holes from top to bottom and is fixed to the metallic stiffener.

3. The electrical connector as claimed in claim 1, wherein the final positioning structure is closer to the CPU than the preliminary positioning structure.

4. The electrical connector as claimed in claim 1, wherein the preliminary positioning structure includes a protruding cylinder protruding upward from the metallic stiffener and a first positioning hole defined on the carrier frame, and the first positioning hole is matched with the protruding cylinder.

5. The electrical connector as claimed in claim 4, wherein the final positioning structure includes a dowel pin protruding downward from the carrier frame and a second positioning hole defined on the insulative housing, and the dowel pin is matched with the dowel pin.

6. The electrical connector as claimed in claim 5, wherein the protruding cylinder is lower than the load plate, the insulative housing comprises four side walls and a bottom wall located inside the four side walls, the conductive terminals are fixed on the bottom wall, and the second positioning hole is defined on the side wall.

7. The electrical connector as claimed in claim 5, wherein radial dimensions of the dowel pin and the second positioning hole are smaller than radial dimensions of the protruding cylinder and the first positioning hole.

8. The electrical connector as claimed in claim 4, wherein the metallic stiffener is fixed to a printed circuit board by a plurality of nuts or screws, and the protruding cylinder is formed by the nuts or screws exposed to the metallic stiffener.

9. The electrical connector as claimed in claim 4, comprising a spacer sleeved on the protruding cylinder, wherein the carrier frame is mounted on the spacer to prevent the CPU from being damaged due to excessive pressing of the carrier frame.

10. An electrical connector for a chip module, comprising:
- an insulative housing loaded with a plurality of conductive terminals therein, and defining a chip-receiving cavity therein;
- a metallic stiffener surrounding the insulative housing;
- a load plate pivotally retained to one end of the metallic stiffener and locked with another end of the metallic stiffener after the load plate is rotated to cover the metallic stiffener;
- a carrier frame used for carrying the chip module;
- wherein the carrier frame loaded with the chip module is directly inserted in the chip-receiving cavity without using any other elements; and
- wherein the carrier frame defines a positioning hole to match with a positioning cylinder protruding upward from the metallic stiffener and a positioning pin extending downward to match with a corresponding hole defined on the insulative housing.

11. The electrical connector as claimed in claim 10, wherein the carrier frame defines an opening receiving the chip module, and the positioning pin is located nearer to the large opening than the positioning hole.

12. An electrical connector adapted for mounting on a printed circuit board, comprising:
- an insulative housing loaded with a plurality of conductive terminals therein;
- a metallic stiffener surrounding the insulative housing and retained on the printed circuit board;
- a load plate pivotally mounted upon the metallic stiffener and moveable between a closed position proximate to the insulating housing and an open position distal from the insulating housing;
- a carrier frame used for retaining and receiving a central processing unit (CPU); and
- a locking member;
- wherein the carrier frame loaded with the CPU is inserted into the insulative housing along a vertical direction perpendicular to the insulative housing and retained by the load plate; and
- wherein the metallic stiffener defines a first locking hole, the carrier frame defines a second locking hole, and the locking member sequentially passes through the first and second locking holes from top to bottom and is fixed to the metallic stiffener.

* * * * *